Figure 1:
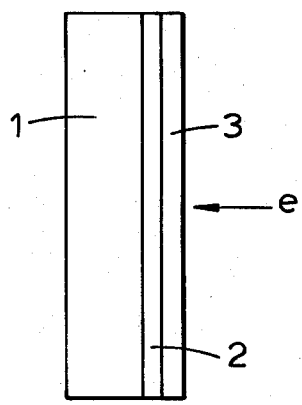

United States Patent [19]

King et al.

[11] 4,137,458

[45] Jan. 30, 1979

[54] ELECTRON IMAGE PROJECTION MASKS

[75] Inventors: Hewson N. G. King, Redhill; Julian P. Scott, Brighton, both of England

[73] Assignee: U.S. Philips Corporation, New York, N.Y.

[21] Appl. No.: 832,180

[22] Filed: Sep. 12, 1977

[30] Foreign Application Priority Data

Sep. 9, 1976 [GB] United Kingdom ............... 37390/76

[51] Int. Cl.² .............................................. A61K 27/02
[52] U.S. Cl. ................................................. 250/492 A
[58] Field of Search ......................... 250/492 A, 492 B

[56] References Cited

U.S. PATENT DOCUMENTS

| | | | |
|---|---|---|---|
| 3,519,873 | 7/1970 | O'Keeffe | 250/492 A |
| 3,895,234 | 7/1975 | O'Keeffe | 250/492 A |
| 4,008,402 | 2/1977 | O'keeffe | 250/492 A |

Primary Examiner—Harold A. Dixon
Attorney, Agent, or Firm—Thomas A. Briody

[57] ABSTRACT

An electron image projection mask consisting of an optical mask comprising a transparent substrate, bearing an opaque mask pattern disposed on the substrate, a transparent coating extending over the mask pattern and the areas of the substrate exposed through the apertures in the opaque mask pattern, and a metal image extending over the transparent coating. The metal image has a pattern corresponding to the apertures in the opaque mask pattern, the optical density of the metal image being such as to reduce the average light transmission through the apertures in the mask to a value between 25 and 80% of the average light transmission of the apertures in the absence of the metal image. Also, a method of producing the electron image projection mask.

4 Claims, 10 Drawing Figures

ELECTRON IMAGE PROJECTION MASKS

The invention relates to electron image projection masks, to methods of making electron image projection masks, and to methods of making semiconductor devices using such electron image projection masks.

Electron image projection masks are suitable for making large patterns containing fine detail on silicon and other substrates, in the manufacture of, for example integrated circuits, magnetic bubble circuits and other devices requiring submicron details. U.S. Pat. No. 3,679,497, an article by T. W. O'Keefe, J. Vine and R. M. Handy in "Solid State Electronics," Vol. 12 (1969) pp 841 to 848, articles by J. P. Scott in "Journal of Applied Physics," Vol. 46 No. 2 (February 1975) pages 661 to 664, and in "Proceedings of Sixth International Conference on Electron and Ion Beam Science and Technology" (Electrochemical Society, Princeton N.J.) pp 123 to 136, discuss methods of projecting an electron image in a wide beam from a photocathode illuminated through windows of a mask which correspond to a desired electron image.

When using electron image projection techniques in the manufacture of semiconductor devices, it is usually necessary to make successive selective exposure to different electron beam patterns because different parts of a semiconductor wafer require successive processing, usually over different areas, to obtain different regions of the device. It is usually necessary for the respective masks used for each of these multiple exposures to be correctly aligned with respect to the semiconductor wafer, and this can be achieved by aligning each mask with a reference marker on the surface of the semiconductor wafer. The marker can be identified by the electron beam, and a signal derived from the marker can be used to correct the position of the mask relative to the marker, see, for example U.S. Pat. Nos. 3,710,101, 3,715,242 (PHB 32022) and 3,832,561, and an article by J. P. Scott in I.E.E.E. Transactions on Electron Devices," Vol ED-22 No. 7 (July 1975), pages 409–413.

A problem that has been encountered when using electron image projection has been that areas in a pattern which have a high average transmission, for example, chevron arrays in magnetic bubble circuit patterns, are overexposed relative to areas in the pattern which have a low average transmission, for example T-bar arrays in magnetic bubble circuit patterns. This overexposure is due to a "proximity effect", described by Chang in J. Vac. Sci. Technol. Volume 12 (1975) page 1271, and is caused by back-scattered electrons.

An object of the invention is to mitigate the effect of the back-scattered electrons and so avoid defects in the developed electron resist pattern made using an electron image projection mask.

The invention provides an electron image projection mask comprising an optical mask comprising a transparent inorganic substrate (as hereinafter defined) bearing an opaque mask pattern, a transparent coating extending over the mask pattern and the areas of the substrate exposed through the apertures in the mask pattern, and a metal image extending over the transparent coating and having a pattern corresponding to the apertures in the opaque mask pattern, the optical density of the metal image being such as to reduce the average light transmission through the apertures in the mask to a value between 25 and 80% of the average light transmission of said apertures in the absence of the said metal image.

An electron image projection mask according to the invention may be made by a method comprising the steps of making an opaque mask pattern on a transparent substrate (as hereinafter defined), forming a transparent coating extending over the opaque mask pattern and the areas of the substrate exposed through the apertures in the opaque mask pattern, wherein at least a surface layer of the transparent coating contains a photosensitive compound which is capable on exposure to light of forming a light-reaction product which is capable of depositing copper and/or Hg, Pd, Pt, Ag or Au from an aqueous solution of the respective salt, exposing the coating through the opaque mask pattern to light from a diffused light source, contacting the exposed coating with an aqueous solution of a salt of copper and/or Hr, Pd, Pt, Ag or Au so as to form a latent image of nuclei of the relevant metal, and physically developing the latent image so as to reduce the average light transmission through the apertures in the mask to a value of between 25 and 80% of the average light transmission of said apertures in the absence of the said metal image. The term "transparent substrate" is understood to be a transparent inorganic substrate, consisting for example, of glass, fused silica or synthetic sapphire.

It was found that by using a diffused light source to expose the photosensitive compound in the transparent coating, only one exposure to light was required even for a mask pattern which included areas having a low coverage (say 5%) of opaque material (for example a T-bar structure in a magnetic bubble circuit) or areas having a higher coverage (say 50%) of opaque material (for example chevron arrays in magnetic bubble circuits).

Masks made by the method according to the present invention may be used in the manufacture of semiconductor devices using, for example the method described in our co-pending United Kingdom Patent Application no. 40776/75 (PHB 32520).

The thickness of the transparent coating of an electron image projection mask according to the invention depends on the range of electrons back-scattered from the substrate bearing an electron-sensitive resist coating which is irradiated with electrons generated by the electron image projection mask. The thickness of the transparent coating should be the range ± 50% of the back-scattered electrons. Thus if the mask is to be used with a silicon substrate where the range of back-scattered electrons is 1–2 $\mu$m, the transparent coating should be from 0.5 to 3 $\mu$m thick. With a tantalum substrate, where the range of back-scattered electrons is from 0.1 to 0.2 $\mu$m thick, the transparent coating thickness should be from 0.05 to 0.3 $\mu$m.

Figure 2:
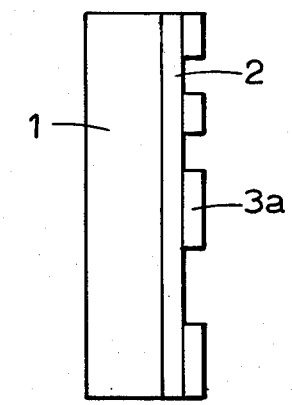
Figure 3:
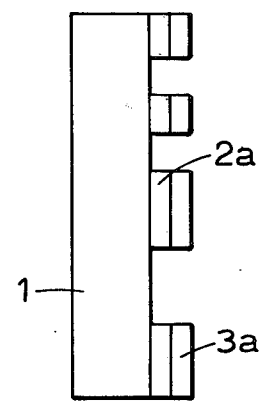
Figure 4:
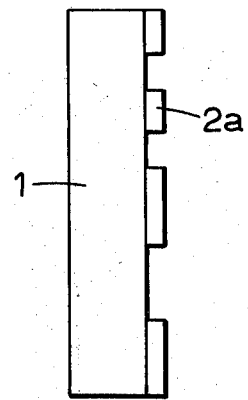
Figure 5:
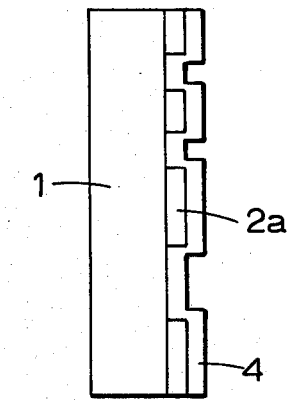
Figure 6:
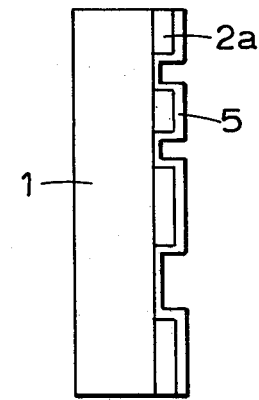
Figure 7:
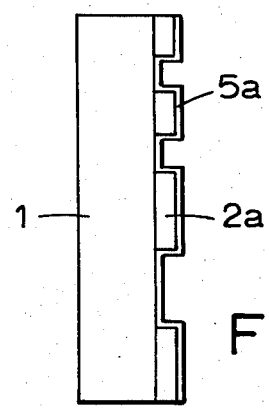
Figure 9:
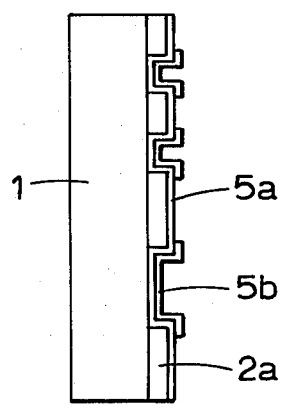
Figure 8:
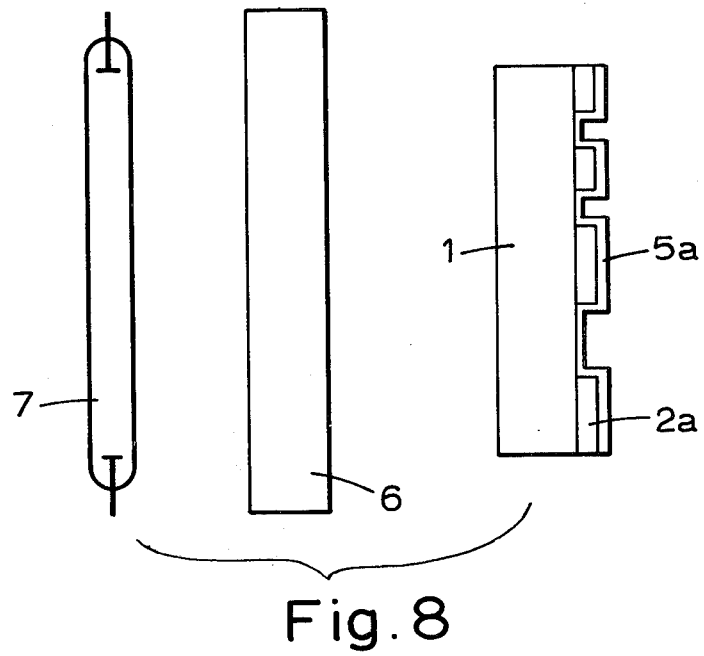
Figure 10:
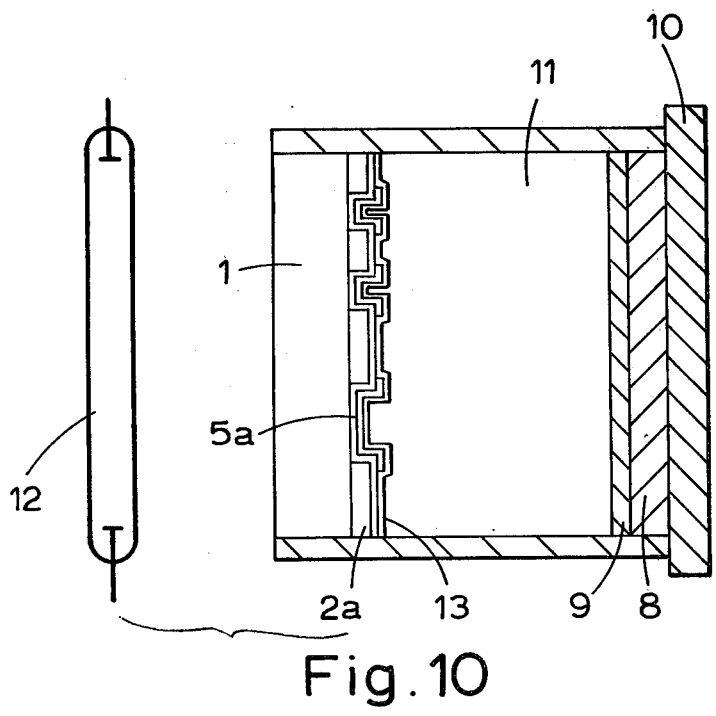

An embodiment of the invention will now be described with reference to the following Example and to the accompanying drawings, in which:

FIG. 1 shows a sectional elevation of an opaquely metallized fused silica substrate bearing a coating of a positive-working electron-sensitive resist, being irradiated with an electron beam, FIG. 2 shows the FIG. 1 assembly after dissolution of the irradiated areas of the resist, FIG. 3 shows the FIG. 2 assembly after the exposed areas of the metallization have been removed by plasma etching, FIG. 4 shows the FIG. 3 assembly after the remaining electron-sensitive resist has been removed, FIG. 5 shows the FIG. 4 assembly after it has been coated with a layer of cellulose acetobutyrate, FIG. 6 shows the FIG. 5 assembly after a surface layer has been saponified, FIG. 7 shows the FIG. 6 assembly after the saponified layer has been sensitised, FIG. 8 shows schematically an arrangement used to irradiate the photosensitised surface layer through the opaque metal mask pattern, FIG. 9 shows the FIG. 7 assembly after a physically developed metal image has been formed on the sensitised saponified layer, and FIG. 10 schematically shows an arrangement used to process a semiconductor wafer.

It should be noted that the thickness of the layers are not shown in the correct proportions with respect to the widths of the apertures.

EXAMPLE

A fused silica disk 1 (65 mm in diameter and 2 mm thick) bearing a 1000 Å thick layer 2 of chromium which had been deposited by sputtering, was coated with a 0.3 μm thick coating 3 of a polymethyl methacrylate positive-working electron-sensitive resist. The resist coating 3 was irradiated with electrons in accordance with a desired pattern (FIG. 1) using an electron beam maskmaker described by J. P. Beasley and D. G. Squire in "I.E.E.E. Transactions on Electron Devices," Vol. ED 22 No. 7, (July 1975), pages 376-384. The irradiated resist coating was developed in a mixture of 95 volumes of propanol-2 with 5 volumes of water for 3 minutes at 20° C, and the developed resist pattern is shown in FIG. 2. The exposed areas of the chromium layer were then plasma etched for 12 minutes using an atmosphere consisting of $5 \times 10^{-1}$ Torr of a mixture of 20 volumes of chlorine, 2 volumes of oxygen and 78 volumes of helium, and the etched mask pattern 2a is shown in FIG. 3. The unirradiated areas 3a of the electron-sensitive resist were then removed by immersion in cold fuming nitric acid (FIG. 4).

A 5 μm thick layer 4 of cellulose acetobutyrate extending over the mask pattern 2a and the exposed areas of the disc 1 (FIG. 4) was prepared by spinning a 15% by weight solution of Tenite 2.236 A in a mixture of methyl glycol acetate, ethanol and acetone (2:1:1 by volume) at 4250 r.p.m. for 30 seconds (FIG. 5). Tenite 2.236 A is a cellulose acetobutyrate injection moulding product of Eastman Chemical Products. The layer 4 was dried in air at 120° C for 1 hour and was 5 μm thick. The layer 4 was saponified by immersing and agitating the coated substrate 1 in a 6.5% by weight solution of potassium hydroxide in a 8:2 volume mixture of methanol water for 7 minutes. The saponified layer 5 (FIG. 6) was approximately 2.5 μm thick. Saponification was stopped by dipping the coated disc 1 in a 9% by weight solution of lactic acid in a 8:2 volume mixture of methanol and water. The coated substrate 1 was then rinsed in water.

The coated disc was immersed for 1 minute in propanol-1 while still wet, and this procedure was repeated twice in fresh propanol-1. The saponified portion 5 was then sensitised by immersing the coated disc 1 in a 0.1 mol./liter solution of 3,5-dichloro-4-dimethylaminobenzenediazo-t-butyl sulphide in propanol-1 for 3 minutes. The coated disc 1 bearing a photosensitive layer 5a (FIG. 7) was then removed from the solution and was dried by spinning at 4000 r.p.m. for 30 seconds.

The photosensitive layer 5a was then exposed for 1 minute through the opaque mask pattern 2a to light from a diffused light source consisting of a sintered quartz screen 6 and a 125 watt HPR high pressure mercury vapour lamp 7, the lamp 7 being 1 meter from the disc 1 (FIG. 8).

The coated disc was then immersed for 2 seconds in an aqueous nucleation solution containing 0.005 mol./liter of mercurous nitrate, 0.025 mol./liter of silver nitrate and 0.01 mol./liter of nitric acid. The coated disc was rinsed in water for 4 seconds and was then immersed for 1 minute in a physical developer which was an aqueous solution containing:

0.050 mol/liter; ferrous ammonium sulphate
0.010 mol/liter; ferric nitrate
0.010 mol/liter; silver nitrate
0.033 mol/liter; citric acid
0.020% by weight; ARMAC (Trade Mark) 12 D
0.020% by weight; LISSAPOL (Trade Mark) N (ARMAC 12D is a cationic surface-active compound consisting of approximately 90% of dodecylamine acetate, approximately 9% of tetradecylamine acetate, and the remainder of higher alkylamine acetates. LISSAPOL N is a non-ionic surface-active compound, consisting of a condensation product of ethylene oxide with alkyl phenols), forming a translucent metal pattern 5b overlying the exposed areas of the photosensitive layer 5a which had been irradiated by diffused light (FIG. 8). This metal pattern 5b reduced the average light transmission of the apertures in the mask to a value of 50% of the average transmission without the metal pattern 5b.

FIG. 10 shows an arrangement for irradiating an electron-sensitive resist layer 9 consisting of a positive-working polymethyl methacrylate resist carried on a silicon slice 8, using the electron image projection mask made by the method described above with reference to FIGS. 1 to 8. A vacuum chamber 11 is closed at one end by the fused silica disc 1 and at the other end by a metal plate 10 carrying the silicon slice 8. A caesium iodide photocathode layer 13 is carried over an electrically conductive transparent titanium layer (not shown) extending over the face of the mask located inside the vacuum chamber 11. The resist layer 9 is irradiated with the desired electron beam pattern by irradiating the mask with ultraviolet light from a mercury vapour discharge lamp 12, after pressure in the vacuum chamber 11 has been reduced to $10^{-4}$ Torr, and while the silicon slice 8 is maintained at + 20 kV relative to the transparent titanium layer. Irradiation of the mask is continued for a time sufficient to obtain satisfactory exposure of the resist layer 9 to the electron image generated by the partially masked photocathode layer 13. The irradiated resist layer is then developed with a mixture of 95 volumes of propanol-2 and 5 volumes of water, and the masked silicon slice may then, for example be doped, using the developed resist layer as a diffusion mask, and using known techniques for depositing and diffusing a dopant.

It will be evident that the opaque mask pattern of a mask according to the invention may consist of materials other than chromium, for example by gold, nickel, aluminium, tantalum, nickel-chromium alloys, chromium sesquioxide and tantalum oxide. Similarly the mask pattern may be made, for example by chemical etching or sputter etching.

What we claim is:

1. An electron image projection mask consisting of an optical mask comprising a transparent substrate, an opaque mask pattern disposed on said substrate, a transparent coating extending over said mask pattern and the areas of said substrate exposed through the apertures in said opaque mask pattern, and a metal image extending over said transparent coating and having a pattern corresponding to the apertures in said opaque mask pattern, the optical density of said metal image being such as to reduce the average light transmission through the apertures in the mask to a value between 25 and 80% of the average light transmission of said apertures in the absence of said metal image.

2. An electron image projection mask as in claim 1, wherein said opaque mask pattern consists of chromium, gold, nickel, a nickel-chromium alloy, tantalum, aluminium, chromium sesquioxide or tantalum oxide.

3. A method of making the electron image projection mask recited in claim 1, said method comprising the steps of providing an opaque mask pattern on a transparent substrate, forming a transparent coating extending over said opaque mask pattern and the areas of said substrate exposed through the apertures in said opaque mask pattern, wherein at least a surface layer of the transparent coating contains a photosensitive compound which is capable on exposure to light of forming a light-reaction product which is capable of depositing copper and/or Hg, Pd, Pt, Ag or Au from an aqueous solution of the respective salt, exposing the coating through the opaque mask pattern to light from a diffused light source, contacting the exposed coating with an aqueous solution of a salt of copper and/or Hg, Pd, Pt, Ag or Au so as to form a latent image of nuclei of the relevant metal, and physically developing the latent image so as to reduce the average light transmission through the apertures in the mask to a value of between 25 and 80% of the average light transmission of said apertures in the absence of the said metal image.

4. A method of manufacturing a semiconductor device, in which method a processing step is effected at an area of a surface of a semiconductor material with the aid of a patterned electron beam generated by means of a photocathode irradiated with light through the electron image projection mask recited in claim 1, wherein the thickness of the transparent coating is the range ± 50% of electrons back-scattered from the semiconductor material.

* * * * *